United States Patent [19]

Bischoff

[11] Patent Number: 4,696,719
[45] Date of Patent: Sep. 29, 1987

[54] MONOMER ATOMIZER FOR VAPORIZATION

[75] Inventor: Gregg C. Bischoff, Gansevoort, N.Y.

[73] Assignee: Spectrum Control, Inc., Erie, Pa.

[21] Appl. No.: 900,241

[22] Filed: Aug. 25, 1986

Related U.S. Application Data

[63] Continuation of Ser. No. 692,746, Jan. 18, 1985, abandoned.

[51] Int. Cl.$^4$ .......................... B01D 3/06; B01D 3/10
[52] U.S. Cl. ..................................... 202/205; 202/235; 159/2.1; 159/900; 159/DIG. 16; 159/DIG. 23; 203/88; 203/91; 239/101; 239/102.1
[58] Field of Search ...................... 202/205, 185.1, 235; 159/2.1, 900, DIG. 16, DIG. 23, 43.1, 16.1; 203/88, 91, 49, 99, 100; 261/78 R; 239/101, 102, 589, 601

[56] References Cited

U.S. PATENT DOCUMENTS

| | | | |
|---|---|---|---|
| 2,192,140 | 2/1940 | McCreary | 202/205 |
| 2,265,762 | 12/1941 | McKittrick et al. | 203/99 |
| 2,437,963 | 3/1948 | Langmuir et al. | 159/900 |
| 2,695,871 | 11/1954 | Shavel, Jr. | 202/205 |
| 2,949,900 | 8/1960 | Bodine | 239/102 |
| 3,103,310 | 9/1963 | Lang | 159/900 |
| 3,273,631 | 9/1966 | Neuman | 159/900 |
| 3,306,829 | 2/1967 | Patterson et al. | 202/205 |
| 3,369,976 | 2/1968 | Temple et al. | 202/205 |
| 3,371,059 | 2/1968 | Rich | 159/900 |
| 4,085,893 | 4/1978 | Durley | 239/102 |
| 4,267,976 | 5/1981 | Chatwin | 239/102 |
| 4,277,025 | 7/1981 | Harvey | 239/102 |
| 4,311,275 | 1/1982 | Lindkvist | 239/102 |
| 4,466,571 | 8/1984 | Mühlbauer | 239/101 |

FOREIGN PATENT DOCUMENTS

| | | | |
|---|---|---|---|
| 0036617 | 9/1981 | European Pat. Off. | 239/102 |
| 0136435 | 10/1979 | Japan | 239/102 |

Primary Examiner—S. Leon Bashore
Assistant Examiner—V. Manoharan
Attorney, Agent, or Firm—Christie, Parker & Hale

[57] ABSTRACT

An atomizer with a capillary passage to a tip surface which is vibrated by a directly coupled ultrasonic device to disperse droplets of liquid fed to the passage. The tip is associated with a heated vaporization chamber, and a cooling chamber between the tip and the ultrasonic device protects the device from the heat of the chamber.

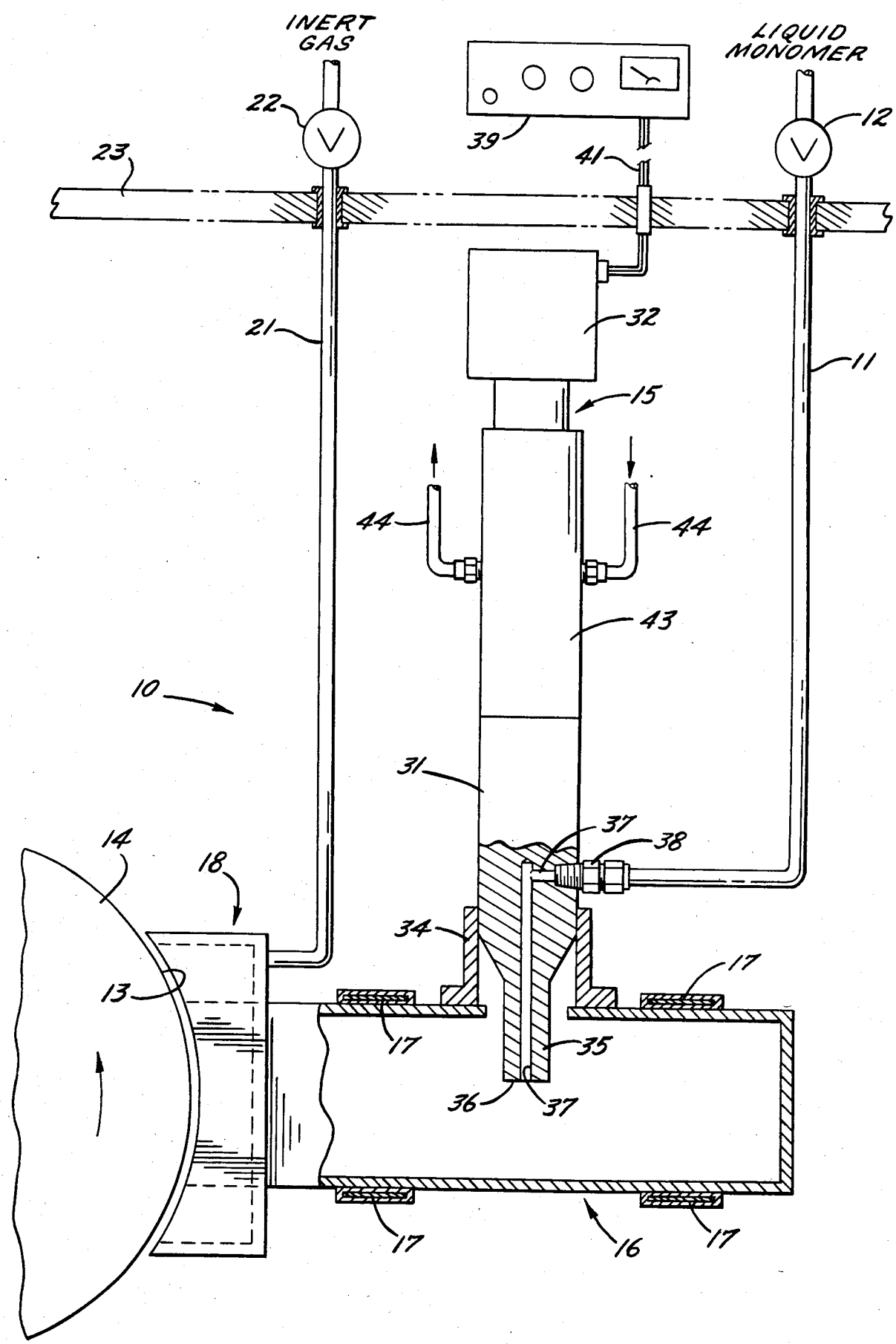

MONOMER ATOMIZER FOR VAPORIZATION

CROSS-REFERENCE TO RELATED APPLICATIONS

This is a continuation of application Ser. No. 692,746, filed Jan. 18, 1985, now abandoned.

This invention relates generally to converting liquids into gaseous form and more particularly concerns atomizing monomeric liquids for flash evaporation.

U.S. application Ser. No. 620,647, filed June 14, 1984, on Miniature Monolithic Multilayer Capacitor and Apparatus and Method of Making, discloses methods and apparatus for making miniature electrical capacitors. The process involves vapor deposition in a deep vacuum environment, and one material that is deposited is a resin in monomer form that, when deposited and cured, forms the dielectric layers of a monolithic capacitor structure.

The techniques of flash vaporization, i.e., subjecting small particles of liquid to vaporization heat for almost instantaneous vaporization, allows the resin to remain in monomer form through the process of being deposited, and then the capacitor making process cures and cross links the material. As just suggested, flash vaporization depends on creating very small particles, i.e., atomizing, the liquid material. Monomers, being rather viscous, are difficult to atomize. Spraying under liquid pressure tends to produce a vaporization rate far in excess of what is desirable for the extremely thin layer deposition desired. Utilizing a compressed gas to create a spray is unsuitable in the vacuum environment utilized for the deposition.

It is an object of the invention to provide an atomizer, particularly suited for flash vaporization and vacuum depositing a monomeric liquid, that creates small widely dispersed droplets of viscous liquid. Another object is to provide an atomizer of the foregoing kind that can be associated directly with a heated vaporization chamber.

A further object is to provide an atomizer as characterized above that is economical to manufacture and maintain, since it is based on standard instruments and structures.

Other objects and advantages of the invention will become apparent upon reading the following detailed description and upon reference to the drawing, in which:

The single FIGURE is a schematic partially sectioned apparatus embodying an atomizer formed in accordance with the invention.

While the invention will be described in connection with a preferred embodiment, it will be understood that we do not intend to limit the invention to that embodiment. On the contrary, I intend to cover all alternatives, modifications and equivalents as may be included within the spirit and scope of the invention as defined by the appended claims.

Turning to the drawing, there is shown an apparatus 10 for vaporizing a monomeric liquid supplied through a line 11 and valve 12, and vacuum depositing the vapor onto a surface 13 carried by a rotating drum 14. The liquid is atomized by a structure 15 embodying the invention, vaporized in a vaporization chamber 16 heated by heaters 17, and deposited through nozzle structure 18 onto the drum surface 13. The nozzle structure 18 controls the vapor deposition in part by confining vapor flow with inert gas, supplied through a line 21 and valve 22. The apparatus 10 is mounted within a vacuum chamber 23.

The general arrangement and overall purpose of the apparatus 10 can be seen by referring to said application Ser. No. 620,647, which is hereby specifically incorporated by reference.

In accordance with the invention, the structure 15 is essentially monolithic with a tip portion 31 at one end extending, and delivering liquid, into the vaporization chamber 16 and having an ultrasonic vibration device 32 coupled at the opposite end. The structure 15 is supported by a collar 34 that closes the chamber opening through which the tip portion 31 extends and which is fixed to the tip portion at approximately its nodal point. The tip portion 31 has a necked-down tip 35 ending in a surface 36 to which the liquid is directed through a capillary passage 37 in the tip portion 31 that is connected to the liquid feed line 11 by a compression coupling 38. The device 32, preferably a piezoelectric crystal transducer, is energized by an electronic power supply 39 through a line 41. Ultrasonic vibration of the tip 35 and its surface 36 causes the liquid to flow from the passage 37, coat the surface 36 and be dispersed in fine droplets through a widespread pattern in the chamber 16. The pattern seen is in the form of a shallow cone when a substantially flat surface like the surface 36 is utilized. Upon striking the hot chamber walls, temperatures of 350° to 400° F. being typical, the liquid is vaporized, creating gaseous pressure driving the vapor through the nozzle structure 18 so as to be deposited on the surface 13.

The lengths of the coupling 43 and tip portion 31 correspond to one-half wavelength of the vibration, and the device 32 is operated at their fundamental frequency mode with maximum amplitude of motion at the surface 36 and minimum movement, or node positions, at the attachment points of the coupling 43 and tip portion 31. Accordingly, end surface 36 will be located at approximately one-quarter wavelength from a nodal position and the length of structure 15 will correspond to one wavelength of the vibration imparted by device 32. To protect the vibration device 32 from heat, the structure 15 includes a cooling coupling 43 interposed between and rigidly connected to the tip portion 31 and the vibration device 32. Cooling water is directed through a passage in the coupling 43 using lines 44. The coupling 43 and the cooling water absorb and remove heat conducted from the vaporization chamber 16 along the tip portion 31 so that extreme temperatures cannot adversely affect the vibrating device 32. To minimize vibration absorption, the lines 38, 44 and the connection with the collar 34 are located at or near the vibration node positions. The structure 15 is left supported cantilever fashion by the collar 34 so that the device 32 can vibrate undampened.

It has been found that a material like titanium alloy 6AL4V is suitable for the tip portion 31. The diameter of the passage 37 is dependent upon the flow rate of the liquid being conveyed through the line 11, and diameters of 20 mils to ⅛" have been found suitable.

The basic structure represented by the tip portion 31, vibration device 32 and electronics 39 can be found in standard laboratory equipment such as ultrasonic emulsifying devices and this utilization of relatively standard components makes the atomizer structure economical to manufacture and maintain.

I claim as my invention:

1. An atomizer for liquids to be vaporized comprising, in combination, an elongated unitary structure having a tip portion at one end, an ultrasonic vibration device coupled to the opposite end of said structure, means for energizing said device to impart ultrasonic vibration to said tip portion, the tip portion having an end surface and defining a capillary passage ending at said end surface, the tip being mounted such that the end surface is located at approximately one-quarter wavelength from a nodal position and means for conveying liquid to said passage for liquid flow onto said surface and dispersion into atomized liquid particles.

2. The combination of claim 1 including a cooling chamber interposed between said tip portion and said device, and means for flowing cooling fluid through said chamber.

3. The combination of claim 1 in which said tip portion has a necked-down tip ending in said surface, said tip portion being solid hard metal except for said passage.

4. A liquid vaporization apparatus comprising, in combination, a vacuum chamber, a heated vaporization chamber mounted in said vacuum chamber, an elongated unitary structure mounted in said vacuum chamber including a tip portion at one end extending into said vaporization chamber, an ultrasonic vibration device coupled to the opposite end of said structure, means for energizing said device to impart ultrasonic vibration to said tip portion, said tip portion having an end surface located approximately one-quarter wavelength from a nodal position and defining a capillary passage ending at said end surface, means for conveying liquid to said passage for liquid flow onto said surface and dispersion into atomized liquid particles to be vaporized, a cooling chamber interposed in said structure between said vaporization chamber and said device, and means for flowing cooling fluid through said chamber so as to thermally isolate the device from the vaporization chamber.

5. An apparatus according to claim 4 wherein the unitary structure also includes a coupling portion connected to the tip portion.

6. An apparatus according to claim 5 wherein the coupling portion includes the cooling chamber.

7. The combination of claims 1 or 4 wherein the length of said tip portion corresponds to one-half wavelength of the vibration imparted by said device.

8. The combination of claims 1 or 4 wherein the length of said structure corresponds to one wavelength of the vibration imparted by said device.

* * * * *